United States Patent
Leatherdale et al.

(10) Patent No.: US 7,573,073 B2
(45) Date of Patent: Aug. 11, 2009

(54) ARRAYS OF LIGHT EMITTING ARTICLES AND METHOD OF MANUFACTURING SAME

(75) Inventors: Catherine A. Leatherdale, Woodbury, MN (US); Timothy D. Fletcher, Lino Lakes, MN (US); Paul S. Lugg, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 41 days.

(21) Appl. No.: 11/561,154

(22) Filed: Nov. 17, 2006

(65) Prior Publication Data

US 2007/0176192 A1    Aug. 2, 2007

Related U.S. Application Data

(60) Provisional application No. 60/738,896, filed on Nov. 22, 2005.

(51) Int. Cl.
*H01L 33/00* (2006.01)
(52) U.S. Cl. ............... 257/98; 257/95; 257/99; 257/E33.073
(58) Field of Classification Search ........... 257/99, 257/95, E33.703, 98
See application file for complete search history.

(56) References Cited

U.S. PATENT DOCUMENTS

| 6,942,360 | B2 | 9/2005 | Chou et al. | |
|---|---|---|---|---|
| 7,070,300 | B2 * | 7/2006 | Harbers et al. | 362/231 |
| 2004/0116033 | A1 | 6/2004 | Ouderkirk et al. | |
| 2006/0091411 | A1 | 5/2006 | Ouderkirk et al. | |
| 2006/0091412 | A1 | 5/2006 | Wheatley et al. | |
| 2006/0091784 | A1 | 5/2006 | Conner et al. | |
| 2006/0091798 | A1 | 5/2006 | Ouderkirk et al. | |
| 2006/0092532 | A1 | 5/2006 | Ouderkirk et al. | |
| 2006/0094340 | A1 | 5/2006 | Ouderkirk et al. | |
| 2007/0026770 | A1 | 2/2007 | Fletcher et al. | |
| 2007/0026774 | A1 | 2/2007 | Fletcher et al. | |
| 2007/0093181 | A1 | 4/2007 | Lugg et al. | |

FOREIGN PATENT DOCUMENTS

| KR | 2002-0035819 | 5/2002 |
|---|---|---|
| KR | 10-2005-0061909 | 6/2005 |
| KR | 10-2005-0090928 | 9/2005 |

OTHER PUBLICATIONS

U.S. Appl. No. 11/381,324, filed May 2, 2006, LED Package With Converging Optical Element.
U.S. Appl. No. 11/381,518, filed May 3, 2006, LED Extractor Composed of High Index Glass.

* cited by examiner

*Primary Examiner*—Victor A Mandala

(57) ABSTRACT

Light-emitting articles and methods of manufacturing such articles are disclosed. In one aspect, a light emitting article includes an optical element having an input and an output aperture, each having a size. An LED die having a size is optically coupled to the optical element. The output aperture size of the optical element matches the LED die size. In another aspect, an array of light-emitting articles includes an array of optical elements having a lapped input aperture surface, and an array of LED dies optically coupled to the optical elements at the input aperture. In another aspect, an array of light-emitting articles includes an array of optical elements, and an array of LED dies, each LED die having a size. Each LED die is optically coupled to an optical element at the input aperture. The output aperture size of the optical element is matched to the LED die size.

19 Claims, 6 Drawing Sheets

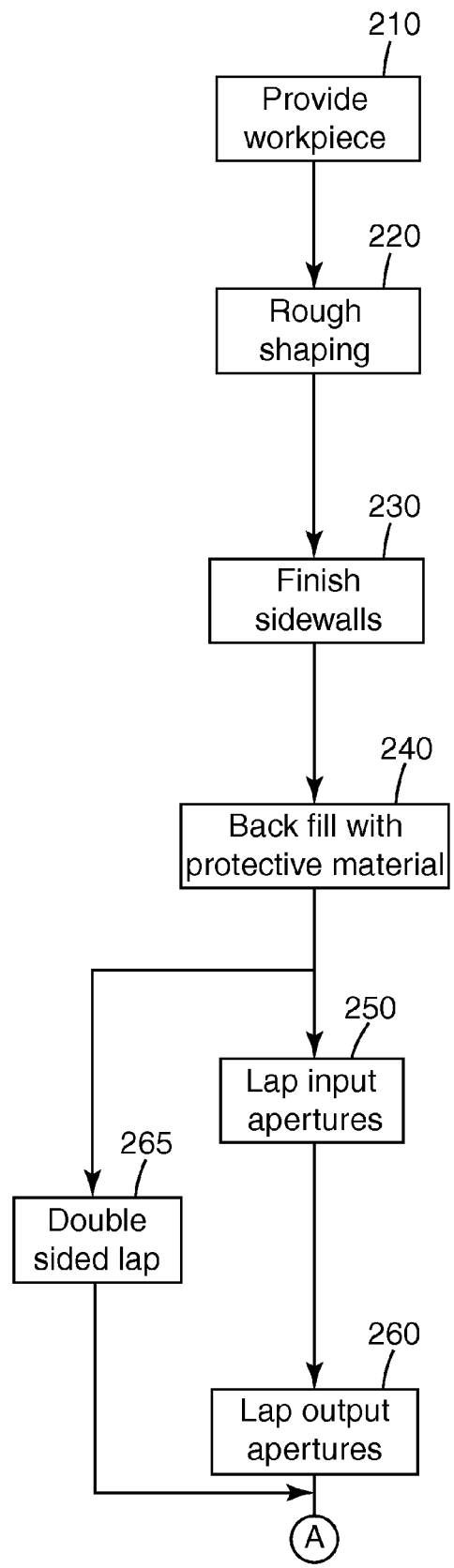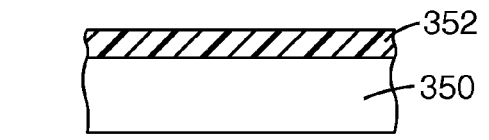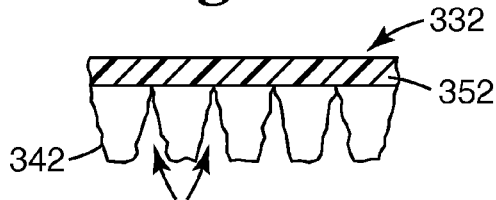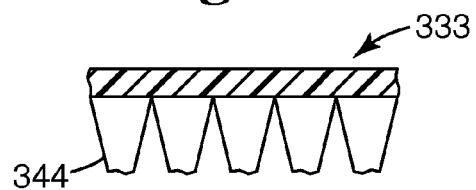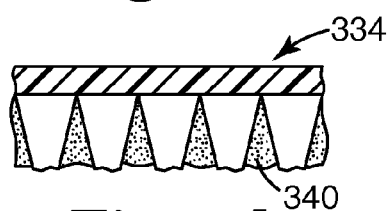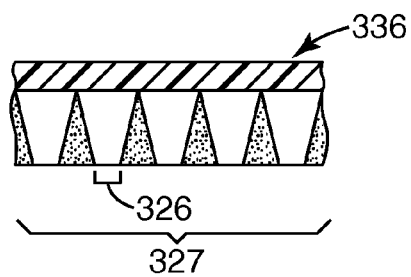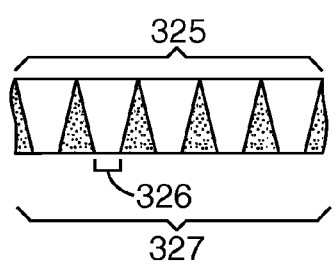

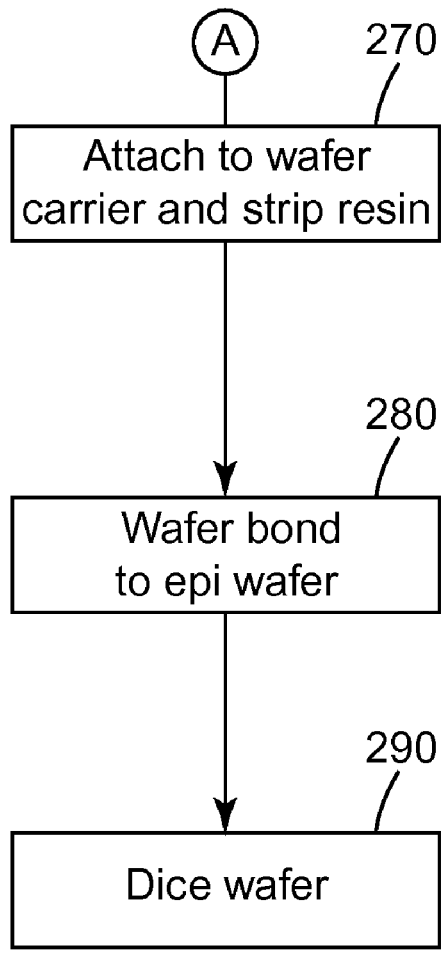
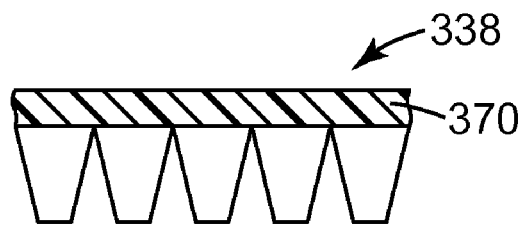
*Fig. 9a*
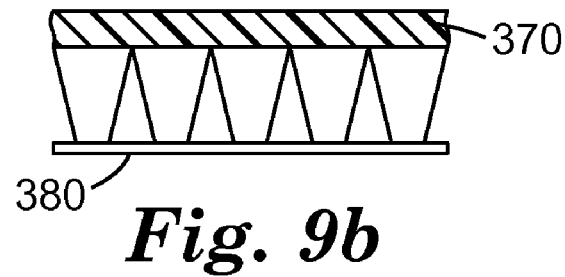
*Fig. 9b*
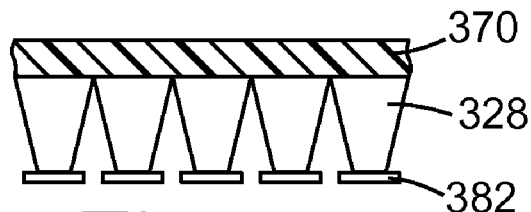
*Fig. 9c*
*Fig. 8*

US 7,573,073 B2

ARRAYS OF LIGHT EMITTING ARTICLES AND METHOD OF MANUFACTURING SAME

CROSS-REFERENCE TO RELATED APPLICATION

This application claims priority to U.S. Provisional Patent Application No. 60/738,896, filed Nov. 22, 2005, the disclosure of which is incorporated by reference herein in its entirety.

FIELD OF INVENTION

The present application relates to light emitting articles and methods of manufacturing such articles.

SUMMARY

The present application discloses arrays of light emitting articles and methods of manufacturing such articles. In one aspect, an array of light emitting articles includes an array of optical elements, each optical element having an input aperture and an output aperture, each aperture having a size, where the array of optical elements has a lapped input aperture surface; and an array of LED dies, each LED die having a size, where each LED is optically coupled to one or more optical elements at the input aperture.

In another aspect, an array of light emitting articles includes an array of optical elements, each optical element having an input aperture and an output aperture, each aperture having a size; and an array of LED dies, each LED die having a size, where each LED die is optically coupled to one optical element at the input aperture, and where the output aperture size of the optical element is matched to the LED die size.

In another aspect, a light emitting article, comprises an optical element having an input aperture and an output aperture, each aperture having a size; and an LED die optically coupled to the optical element, the LED die having an LED die size, and wherein the output aperture size of the optical element is matched to the LED die size.

The above summary of the present disclosure is not intended to describe each disclosed embodiment or every implementation of the present disclosure. These and other aspects of the present disclosure will be apparent from the detailed description below. In no event should the above summaries be construed as limitations on the claimed subject matter. The claimed subject matter is defined solely by the attached claims, which may be amended during prosecution.

BRIEF DESCRIPTION OF THE DRAWINGS

The disclosure may be more completely understood in consideration of the following detailed description of various embodiments of the disclosure in connection with the accompanying drawings, where like reference numerals designate like elements. The appended drawings are intended to be illustrative examples and are not intended to be limiting.

FIG. 6 is a block diagram illustrating an exemplary manufacturing method according to a second embodiment.

FIGS. 7a-f are schematic side views of an array of optical elements during the manufacturing steps shown in FIG. 6.

FIG. 8 is a block diagram illustrating additional steps in a third embodiment of a manufacturing method.

FIGS. 9a-c are schematic side views of an array of optical elements during the manufacturing steps shown in FIG. 8.

DETAILED DESCRIPTION

Optical elements and semiconductor elements having at least one dimension of less than a few millimeters are currently fabricated by a number of processes. These processes include molding, lapping individual elements, casting the optical elements from a sol-gel followed by sintering, microreplication, and processes using surface tension or shrinkage to form desired shapes. Of these processes, only lapping allows the production of precise shapes from refractory or crystalline materials. However, for producing a large number of optical elements, lapping is one of the slowest and most expensive processes because each shaped element must be handled individually.

The present application discloses methods of manufacturing arrays of optical elements. These methods include providing an array of roughly shaped optical elements, filling the spaces between adjoining optical elements with a removable protective material to form a mechanically stable array of optical elements, and lapping the mechanically stable array to impart a desired shape and surface finish to the optical elements.

The presently disclosed methods are particularly useful for manufacture of optical elements such as those used for light extraction in light emitting devices (LEDs). When lapping is desired for an optically smooth final surface finish, typically such optical elements are manufactured as individual elements. When assembled together with an LED die, handling individual LED die/optical element pairs is slow and cumbersome. The present application discloses methods of manufacturing arrays of optical elements in a way that allows for assembly together with arrays of LED dies, thus creating a multitude of individual LED die/optical element pairs. By assembling the array of optical elements together with the array of LED dies before separating into individual pairs of lighting elements, the process is faster and more cost effective.

Figure 1:
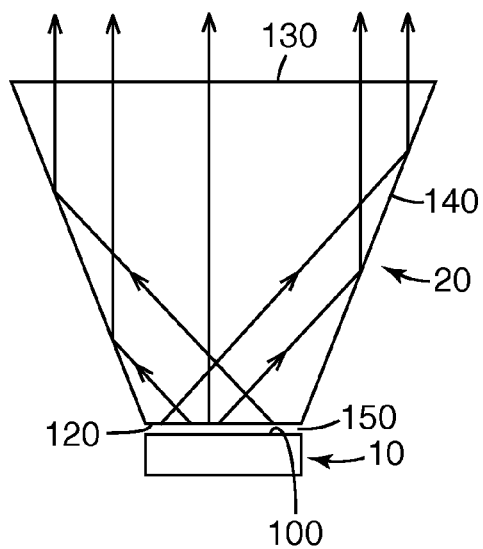
FIG. 1 is a schematic side view illustrating an optical element and an LED die in one embodiment.

FIG. 1 is a schematic side view illustrating a configuration of an optical element 20 and an LED die 10 in an exemplary embodiment. The optical element 20 is transparent and preferably has a relatively high refractive index.

Figure 2A:
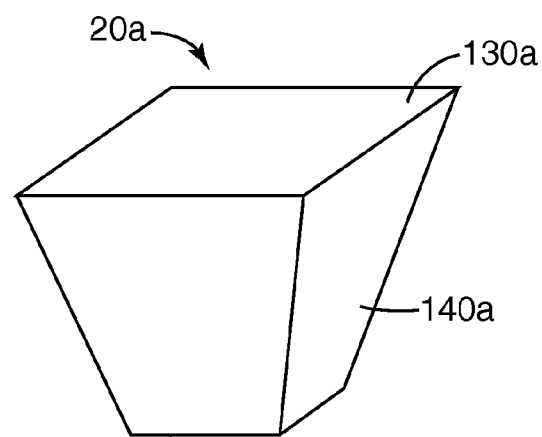
FIGS. 2a-c are perspective views of exemplary shapes of optical elements.
Figure 2B:
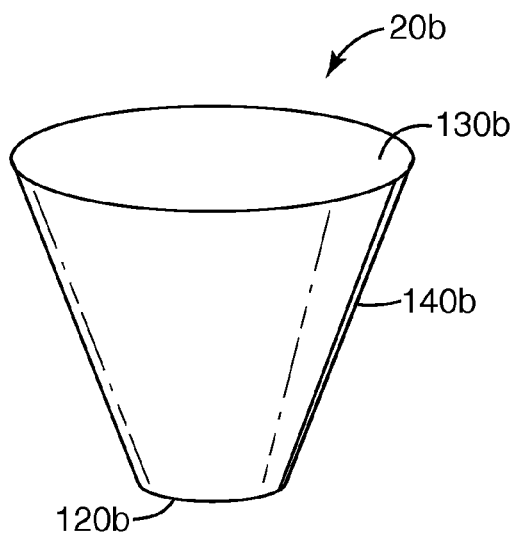
Figure 2C:
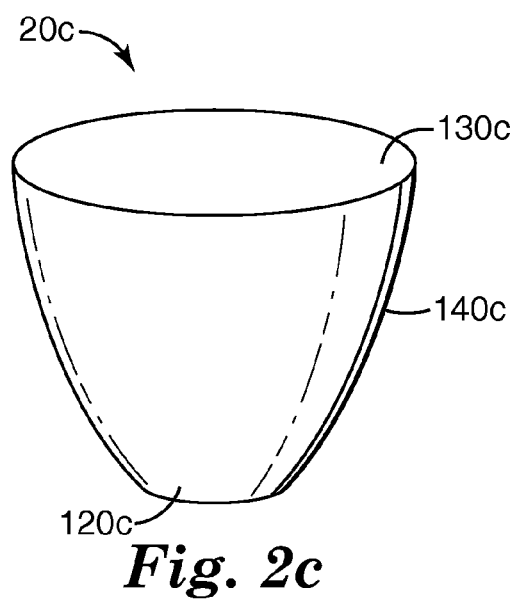

In some embodiments, the optical element can be shaped in the form of a taper as shown in FIG. 1. A tapered optical element can have numerous forms, including without limitation, those shown in FIGS. 2a, 2b, and 2c. A tapered optical element is a particularly advantageous shape of the optical element. In FIG. 2a, a tapered optical element 20a has an output aperture 130a that is larger than an input aperture 120a. Tapered shapes, including a truncated inverted pyramid (TIP) shown in FIG. 2a, a truncated cone shown in FIG. 2b, and a shape with parabolic sidewalls as shown in FIG. 2c, and combinations thereof, provide the additional benefit of collimating light and are referred to herein as optical collimators. Using an optical collimator to extract light out of an LED die is particularly advantageous because it provides control over the angular distribution of the emitted light. Additional shapes for optical collimators will be apparent to those skilled in the art. For example, a TIP shape, shown in FIG. 2a can be modified to have curved sidewalls similar to those shown in FIG. 2c. Other variations are contemplated. For example, a sidewall can include a series of linear segments, a series of curved segments or a combination thereof. When made of high index materials, such optical elements increase light extraction from the LED die due to their high refractive index and collimate light due to their shape, thus modifying the angular emission of light. It will be understood by those skilled in the art that when collimation is less important or is not desired other shapes of optical elements may be used.

In FIG. 1, the LED die 10 is depicted generically for simplicity, but can include conventional design features as known in the art. For example, LED die 10 can include distinct p- and n-doped semiconductor layers, buffer layers, substrate layers, and superstrate layers. A simple rectangular LED die arrangement is shown, but other known configurations are also contemplated, e.g., angled side surfaces forming a truncated inverted pyramid LED die shape. Electrical contacts to the LED die 10 are also not shown for simplicity, but can be provided on any of the surfaces of the die as is known. In exemplary embodiments the LED die has two contacts both disposed at the bottom surface. This LED die design is known as a "flip chip". The present disclosure is not intended to limit the shape of the optical element or the shape of the LED die, but merely provides illustrative examples.

The tapered optical elements have an input aperture 120, an output aperture 130, and at least one intermediate sidewall 140 disposed between the input aperture and the output aperture. If the optical element is shaped in the form of a truncated inverted pyramid, as shown in FIG. 2a, then such an optical element 20a contains four intermediate side walls 140a. If the optical element is rotationally symmetric, then it can have a single side wall. For example if the optical element is shaped as an inverted cone as shown in FIG. 2b or shaped with parabolic sidewalls as shown in FIG. 2c, then such an optical element 20b or 20c has a single sidewall 140b or 140c, respectively. Other shape variations can be used. Each optical element depicted in FIGS. 2a, 2b, and 2c contains an input aperture 120a, 120b, and 120c and an output aperture 130a, 130b, and 130c, respectively. The shapes and cross sections of the input apertures and the output apertures can vary. Exemplary shapes include square, rectangular, or circular apertures, or combinations thereof. The cross sections can vary in shape between the input and output apertures (e.g., an optical element having a square input aperture and a rectangular output aperture or a circular input aperture with a square output).

Figure 3:
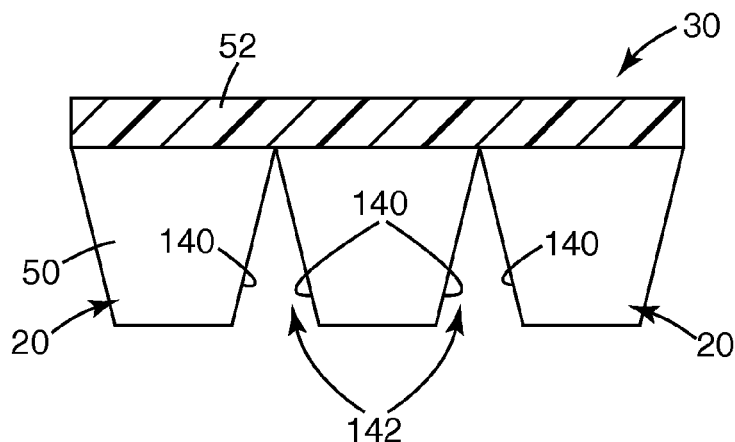
FIG. 3 is a schematic side view of an array of optical elements.

FIG. 3 shows an array 30 of tapered optical elements 20 made of a substrate material 50. A plurality of individual optical elements 20 form the array, while the sidewalls 140 of adjoining optical elements form channels 142 in the array. Such an array of optical elements can be made by molding glass or by abrading a workpiece into an array of roughly shaped elements. When made by abrading, a workpiece typically contains the substrate material 50 and a carrier 52. Optionally, the substrate and carrier materials can be integral. When molded from glass, the substrate and carrier material can be glass. Optical elements can be molded using other materials such as glass-ceramic materials, or fine grain polycrystalline ceramics via injection molding, or sol-gel derived glass or crystalline materials.

Suitable substrate materials include optical materials such as inorganic glasses and ceramics (e.g. calcite, sapphire, zinc oxide, silicon carbide, diamond, zirconia) or combinations thereof. Particularly useful glasses include, without limitation, lead-free glasses having refractive indexes greater than about 1.7 and glass transition temperatures less than 750° C., preferably glass transition temperature less than 650° C. Glasses with lower coefficients of thermal expansion are preferred. Exemplary glasses include n-LAF7, n-LAF3, n-LAF33, and n-LASF46 all available from Schott (Germany) and S-NPH2 available from Ohara Corporation (Japan). Other suitable glasses are described U.S. patent application Ser. No. 11/381,518 (Leatherdale et al.) entitled LED EXTRACTOR COMPOSED OF HIGH INDEX GLASS.

Optical materials may also include laminates of these materials, for example, silicon carbide bonded to glass, sapphire bonded to glass, calcite bonded to glass, and polymer films bonded to glass. Advantageous characteristics of optical materials include a thermal diffusivity of at least 0.01 $cm^2/s$, transparency, a high refractive index, low color, and low toxicity.

The substrate material 50 may also include semiconductor material such as silicon or semiconductors deposited on silicon carbide or sapphire. Though the substrate material may include any type of optical and/or semiconductor material, abrading and polishing with a patterned abrasive is particularly advantageous for fragile, extremely hard, and/or temperature sensitive materials—materials that are very difficult to cut using conventional methods and are non-moldable. Carrier 52 can be made using any of a number of materials well known in the art. Suitable materials should be very mechanically stable. Carrier 52 can alternatively be the same material as the substrate material.

Figure 4A:
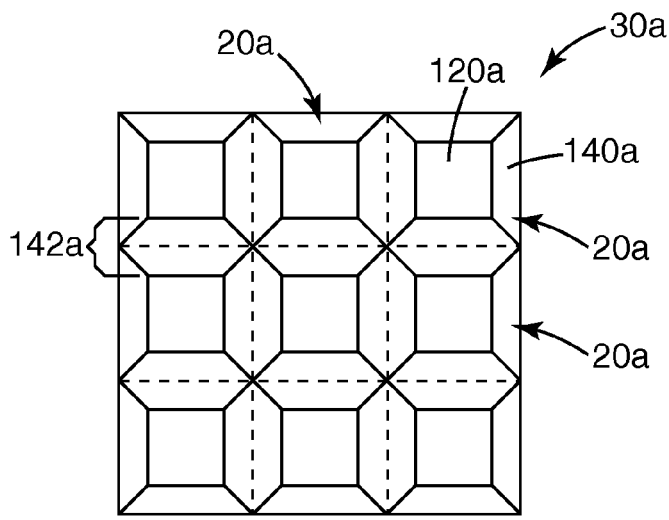
FIGS. 4a-b are bottom views of two alternative arrays of optical elements.
Figure 4B:
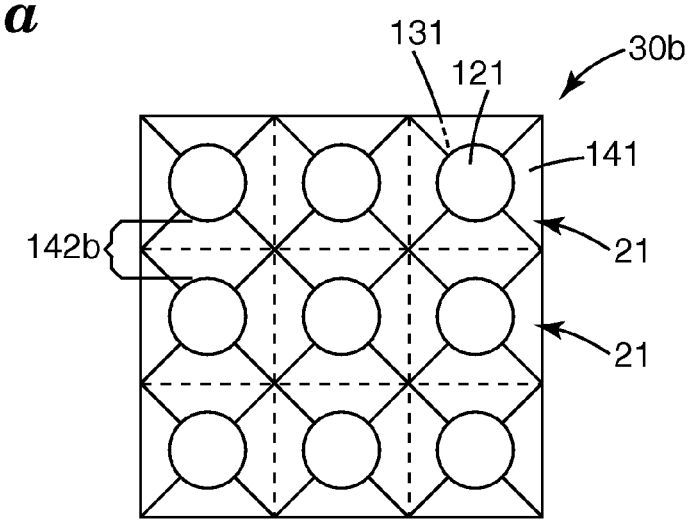

FIGS. 4a and 4b show bottom views of two exemplary arrays (30a and 30b, respectively) of optical elements (20a and 21, respectively). FIG. 4a depicts an array of optical elements 20a each shaped as a truncated inverted pyramid having a square cross section. Each optical element 20a has four sidewalls 140a, an input aperture 120a, and an output aperture 130a. The sidewalls 140a of adjoining optical elements form channels 142a in the array 30a. For applications involving TV's, LCD monitors or displays, it may be advantageous to provide optical elements and LED dies having a rectangular cross section with an aspect ratio commonly used in those applications (e.g. 16:9 or 4:3). FIG. 4b shows another embodiment of an array 30b of tapered optical elements 21. In this array, individual optical elements 21 have a circular input aperture 121 and a square output aperture 131. The sidewalls 141 are shaped to connect the input and output apertures accordingly. The sidewalls 141 of adjoining optical elements 21 form channels 142b in the array 30b.

Figure 5A:
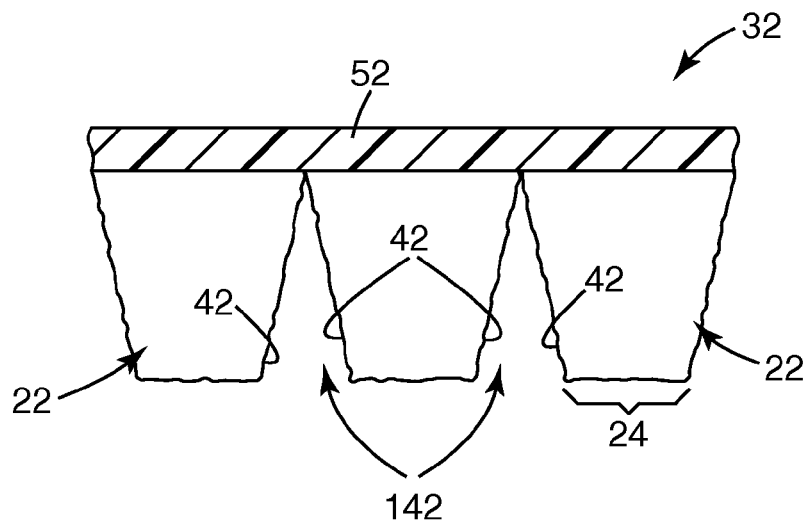
FIGS. 5a-c are schematic side views of an exemplary array of optical elements in three steps of a first embodiment of a manufacturing method.
Figure 5B:
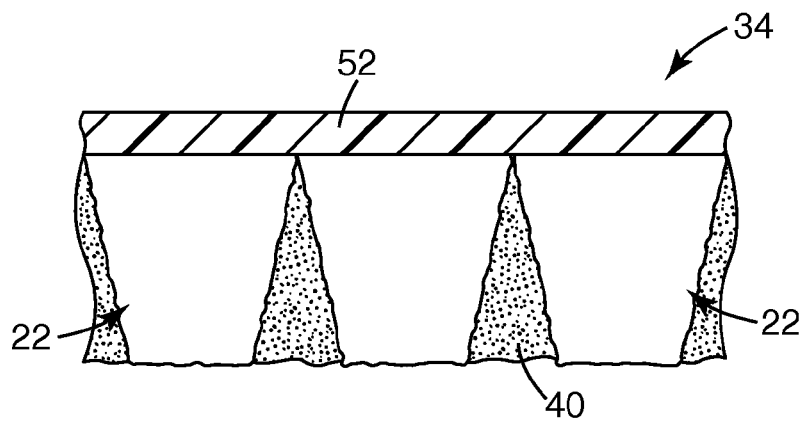
Figure 5C:
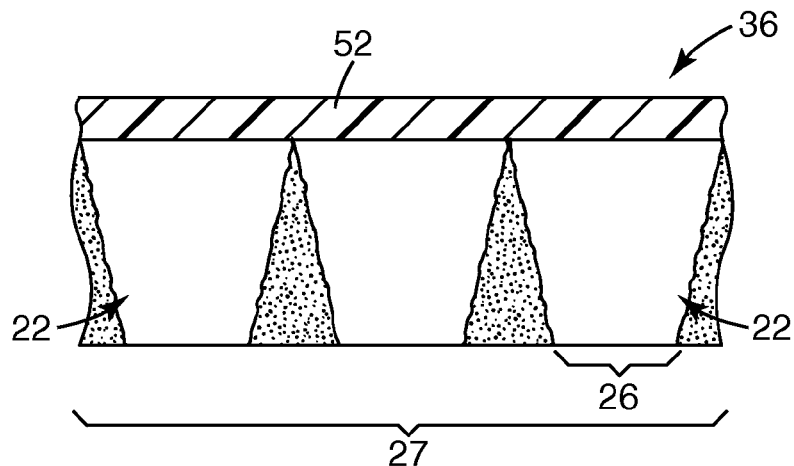

FIGS. 5a-c show one embodiment of the present manufacturing method. The first step in this embodiment is to provide an array 32 of roughly shaped optical elements 22. FIG. 5a shows a cross-sectional view of an exemplary array of three roughly shaped optical elements 22. Each shaped element has one or more sidewalls 42. The sidewalls 42 of adjoining optical elements 22 form channels 142 in the array 32. The array of roughly shaped optical elements can be prepared by molding glass elements into the array of optical elements, by grinding or abrading a work piece into an array of roughly shaped optical elements, or by other methods known in the art. For example, an array of roughly shaped elements can be prepared from a work-piece, where the work-piece is abraded to at least partially form channels that define an array of shaped elements as described in U.S. Patent Publication No. 2006/0094340 (Ouderkirk et al.), entitled PROCESS FOR MANUFACTURING OPTICAL AND SEMICONDUCTOR ELEMENTS. Alternatively, an array of roughly shaped elements can be formed by molding or viscous sintering. For example, a high index glass such as N-LASF46 (available from Schott North America, Inc., Elmsford, N.Y.) can be heated above its softening point and allowed to slump into a suitably shaped platinum coated tungsten carbide mold.

The second step in this embodiment is filling the channels of the array with a removable protective material to form a mechanically stable array. FIG. 5*b* shows the array of roughly shaped optical elements 32 of FIG. 5*a* filled with a removable protective material 40 to form a mechanically stable array 34. Protective materials can be applied from a coating from a solvent, directly applied as liquids, or applied using a transfer tape. Some materials may require hardening after application. For example, curable materials such as thermosets could be hardened using an energy source such as heat, light, or a combination thereof. Thermoplastic materials could be hardened by cooling below their glass transition temperature.

Suitable protective materials should be mechanically robust, have good adhesion to the optical elements, and be removable from the array of optical elements without damaging the optical elements. In some embodiments, it may be preferred that the removable protective materials are not be soluble in any slurry material used during the lapping process (typically aqueous based) and have properties such that they abrade at substantially the same rate as the optical elements. Some examples of suitable polymers include acrylics such as polymethyl methacrylate, polyphenyl acrylate, and polyisoborynl acrylate. Other useful polymers include polyolefins (like polyethylene and polypropylene), polystyrene, polyesters, polyamides (nylons), epoxy resins, polyurethanes, polyethers, and polycarbonates. Linear polymers are preferred. Hard waxes, natural and synthetic pitch can also be used. Exemplary materials include ACCULAP Synthetic Optical Pitch (available from Sutton Technologies, Inc., Star, N.C.). Low functionality oligomers can also be used. In this case oligomer is mixed with a suitable curing catalyst such as is known in the art, the mixture is deposited in the spaces between the elements and then is cured using heat, light, or a combination thereof. Certain sol-gels, other inorganic precursors, low melting point metals, low melting point glasses, and plaster of Paris can also be used provided they can be removed without damaging the optical elements. Curing can include increasing the average molecular weight, cross-linking, or other indicators of polymerization, as is known in the art.

The third step in this embodiment is lapping the mechanically stable array 34 to a desired shape and surface finish. In FIG. 5*c*, a single-sided lapping step is employed to lap the input aperture side of the optical elements 22. Each roughly shaped optical element 22 of FIG. 5*a* has a rough input aperture 24. After lapping, each optical element in the array 36 of FIG. 5*c* has a lapped input aperture 26. The array of optical elements 36 has a lapped input aperture surface 27. An array of optical elements having a lapped input aperture surface would typically have optical elements that are substantially co-planar and exhibit the same surface topology, e.g., surface roughness.

In some embodiments, the protective material fills the channels in the array in such a way that when lapped, both the protective material and the optical element material are lapped. In this case, the lapped surface 27 includes the plurality of optical elements together with the protective material filling the channels in the array, as shown in FIG. 5*c*. In other embodiments, the protective material can partially fill the channels in the array. In this case, the lapped surface 27 is formed by the plurality of optical elements alone.

Optionally, further steps can be added to the presently disclosed method. Exemplary additional steps are described in context of a second embodiment.

FIG. 6 is a block diagram illustrating the presently disclosed manufacturing method according to a second embodiment. FIG. 7 shows schematic side views of an array of optical elements during the corresponding manufacturing steps of FIG. 6. In the embodiment shown in FIGS. 6 and 7, an array of roughly shaped optical elements can be prepared by abrading a workpiece having of a substrate material 350 and a carrier 352. FIG. 7*a* shows the workpiece before any shaping takes place.

FIG. 7*b* shows the array of roughly shaped optical elements 332. Rough shaping (step 220 of FIG. 6) can be done by grinding or abrading the workpiece shown in step 210. Optical elements can be produced by making two sets of grooves 90 degrees apart on one surface of the workpiece using a rough grinding process. The grooves can be made using a shaped diamond saw or by form grinding using a shaped surface grinding wheel or a shaped fixed abrasive such as a 3M Trizact™ Diamond Tile (see U.S. Patent Publication No. 2006/0094340). Alternatively, rough shaping (220) can also be done by molding a glass blank such that one surface of the blank is flat while the other surface has a plurality of roughly shaped optical elements. Using either method, the roughly shaped optical elements can be made taller than the final optical elements to compensate for removal of the some of the material during the lapping step.

Step 230 of FIG. 6 is an optional step of finishing the sidewalls of the optical elements to a desired surface finish. In this step the final geometry, both angles and surface roughness, of the angled sidewalls of the optical elements can be achieved. The finishing process can be a one or two step process depending on how close the rough grind or molding process was to final tolerance.

If the final geometric tolerances are not achieved during the rough shaping step 220, the finishing step can include an optional fine grinding process, as well as an optional polishing process. Fine grinding of the optical elements can be accomplished by making two sets of grinding traces, 90 degrees apart on the structured surface of the workpiece, following the grooves from the rough grind or molding operation. The fine grinding operation can be done with either a shaped diamond wheel or methods described in U.S. Patent Publication No. 2006/0094340 (Ouderkirk et al.). The amount of stock removal needed can be determined by calculating what is needed to achieve the geometrical tolerances on the angled sidewalls 342 of the optical elements. A polishing process can then be employed to achieve the final surface finish on each of the angled faces of the optical elements.

If final tolerance for angle has been met, only a polishing process can be used produce the final surface finish on the angled sidewalls of the optical elements. Polishing can be done using a number of conventional polishing techniques, including both loose and fixed abrasive polishing, as described in co-pending U.S. Patent Publication No. 2006/0094340 (Ouderkirk et al.).

For example, polishing can be accomplished by using a resilient pad material (shaped or flat) with an abrasive in a slurry form. Alternatively, polishing can be done using a resilient fixed abrasive pad (shaped or flat). A shaped polishing pad may be preferred when deep channels are desired. In the case of hard ceramic materials it may be desirable to use the polishing techniques using an abrasive article including precisely shaped abrasive composites having a resin phase and a metal phase, as described in co-pending U.S. application Ser. No. 11/254,614 (Lugg et al.), entitled ABRASIVE ARTICLE AND METHOD OF MODIFYING THE SURFACE OF A WORKPIECE. In the case of glass materials it may be desirable to use conventional polishing pads and slurries (e.g., porous polyurethane pad using an abrasive slurry). Cerium oxide abrasives can be used for silica containing materials. Alumina or diamond abrasives can be used for harder ceramic materials such as sapphire. Magnetorheological finishing (MRF) techniques can also be used for polishing.

FIG. 7c shows the array 333 of optical elements having finished sidewalls 344.

If the sidewalls 342 of the roughly shaped optical elements in step 220 (FIG. 7b) are of acceptable angle and finish, step 230 can be omitted. Alternatively, step 230 can be preformed after the lapping step 250, provided that the protective material was removed before the finishing step.

In step 240 of FIG. 6, the channels of the array are backfilled with a protective material 340, such as a soluble polymer, to form a mechanically stable array 334. FIG. 7d shows the array of optical elements with the protective material 340 filling the channels 342 in the array. In this process, the optical elements are surrounded by the protective material that facilitates subsequent finishing operations. One such material could be a soluble polymeric material such as a solvent developable photoresist. The purpose of encapsulating the angled sides of the optical elements is to provide support for them during subsequent lapping operations, prevent chipping, and reduce edge roll off during lapping and polishing. This material should be mechanically robust enough to withstand the lapping during step 250. Preferably, the channels 342 are filled only to the tops of the optical elements to avoid the need for an additional grinding step to remove excess encapsulant prior to the lapping step. Alternatively, the channels 342 can be partially filled, provided that the amount of protective material still serves to mechanically stabilize the array of optical elements. The protective material should not be soluble in the slurry material used in step 240 but should still be easily removed, for example using a suitable solvent, as described below.

In some embodiments, the mechanically stable array 334 of optical elements together with the protective material can be provided for further processing. Examples of further processing include attaching the optical elements to a corresponding array of LED dies, which will be described below. In other embodiments, the protective material can be removed prior to further processing steps.

In step 250 of FIG. 6 and shown in FIG. 7e, the mechanically stable array 334 formed in step 240 is lapped to provide a lapped surface 327. Lapping provides a desired surface finish to the input apertures 326 of the optical elements. In this process, the extra material underneath the optical elements is removed, the final height of the optical elements is achieved, and the desired surface finish is produced on the wafer bonding or input aperture surface 326. Lapping can be performed using methods known in the art. For example lapping can be performed with either fixed abrasives (e.g. 3M Trizact™ Diamond Tile) or loose abrasives (e.g. alumina or diamond) on a metallic plate (e.g. cast iron). For hard ceramic materials or very hard glasses it may be desirable to employ methods described in co-pending U.S. application Ser. No. 11/191,722 (Fletcher et al.), entitled SELF-CONTAINED CONDITIONING ABRASIVE ARTICLE; co-pending U.S. application Ser. No. 11/191,711 (Fletcher et al.), entitled ABRASIVE AGGLOMERATE POLISHING METHOD; and co-pending U.S. application Ser. No. 11/254,614 (Lugg et al.), entitled ABRASIVE ARTICLE AND METHOD OF MODIFYING THE SURFACE OF A WORKPIECE.

In step 260 of FIG. 6 the output aperture side of the mechanically stable array is lapped. FIG. 7f shows the mechanically stable array having a lapped output aperture surface 327. The thickness of the glass or ceramic material between the individual optical elements will be very small (possibly zero) after this step. The optical elements will be held together primarily by the protective material 340 applied in step 240.

Alternatively, lapping steps 250 and 260 can be combined into one double-sided lapping step 265. With double-sided lapping, the final surface finish (e.g. an optically smooth finish) can be produced simultaneously on both the input aperture and output aperture sides of the optical elements. The double-sided lapping process is very fast and makes it significantly easier to prepare large numbers of high quality optical elements in high yield and with good parallelism between the input and output aperture sides of the optical elements. For example, with a small taper angle and narrow gaps between the optical elements it could be very difficult to polish or lap right to the top of the channels, even with a shaped abrasive. With the presently disclosed methods, the initial optical element height can be made somewhat larger than the final product and then a portion of one or both the top and bottom of the optical element can be removed through single- or double-sided lapping. The pitch of the optical elements can still be minimized in this process, maximizing the yield per wafer. Doubled sided lapping also yields high quality optical surfaces on the input apertures, ideal for wafer bonding or optical coupling to the emitting surface of the LED die.

Optionally, the lapped surface(s) can also be polished to provide an optically smooth finish. Polishing can be performed on a porous polyurethane, polymer composite, or synthetic pitch polishing pad and using an abrasive slurry. Cerium oxide abrasives can be used for silica containing materials. Alumina or diamond abrasives can be used for harder ceramic materials such as sapphire. Alternatively, silica abrasives (preferably colloidal silica) can be used for final polishing of sapphire (via a chemical mechanical polishing operation).

For some applications, it may be desirable to produce an array of optical elements bonded to wafer or LED die elements. FIG. 8 shows additional optional steps that could be used with the presently disclosed methods. Additional processing steps shown in FIG. 8 include attaching the optical elements to a wafer carrier (step 270), wafer bonding with the array to an epi-wafer (step 280), and dicing the wafer to produce individual optical elements bonded to LED die elements (step 290). The methods disclosed herein provide such bonded optical element/LED die pairs in a single manufacturing operation. For some applications the size of the LED die and the size of the output aperture of the optical element can be designed to match. This is advantageous for high volume production.

FIGS. 9a-9c show schematic side views of an array of optical elements during the manufacturing steps of FIG. 8.

Step 270 of FIG. 8 and the corresponding FIG. 9a show an optional step of attaching the optical elements to a wafer carrier 370. A suitable wafer carrier material can be attached to the output aperture side of the array of optical elements. The attached wafer carrier 370 provides support for the optical elements as the protective material 340 is removed prior to bonding to an epi-wafer 380 (step 280). The wafer carrier 370 can be attached using an adhesive. For example, a 3M Wafer Support System which employs a unique, UV-curable 3M adhesive to bond wafers to a rigid, uniform support surface can be used. This would minimize stress on the optical element array during wafer bonding (step 280) and singulation of the optical elements (step 290).

Next, the protective material can be removed to expose the array of individual optical elements 338. Depending on the particular removal process, suitable steps can be taken to preserve the finish quality of the optical element surfaces during the removal process. When using photoresist, standard photoresist removal processes such as ashing or chemical etching can be employed to remove the protective material. Other suitable methods for removal of the protective material include, without limitation, heating (e.g., to melt or soften a thermoplastic material or low melt metal), plasma ashing, pyrolysis, and degradation by laser. Alternatively, the protective material 340 can be removed from the array of optical elements before attaching to a wafer carrier. In some embodiments, it may be desirable to remove only a small portion of the protective material prior to bonding, for example, etching back 5-10% of the protective material thickness to stabilize the array for bonding while still allowing for clean contact of the array of optical elements to the epi-wafer.

FIG. 8 at step 280 and FIG. 9b show the step of wafer bonding the array of optical elements to an epi-wafer 380. The epi-wafer 380 includes an array of LED dies. During this step the input aperture surface of the optical element array can be bonded to the surface of the epi-wafer 380 using suitable bonding techniques. When using a flip chip LED design, alignment of the optical elements to the LED dies on the epi-wafer 380 can be accomplished prior to bonding. For example, the array of optical elements can be aligned to the array of flip-chip LEDs using a mask aligner such as is used in conventional photolithography. Since the substrate and semiconductor layers are transparent in the visible, one could image through epi-wafer, identify the etched metal contacts or other opaque fiducial markings on the back side of the epi-wafer, and align these axes with the cross-hairs on the microscope image. The microscope objective could then be focused on the plane of the array of optical elements and the array could similarly be aligned (e.g., centered and rotated by using the x, y and $\theta$ controls on an aligner stage) with the cross hairs on the microscope or machine vision system. Finally, the array of optical elements and the epi-wafer can be brought into intimate contact while performing fine adjustments on x, y, and $\theta$ and bonded using techniques described previously.

Step 290 of FIG. 8 and FIG. 9c show the singulation or wafer dicing step in which a plurality of individual optical elements 328 bonded to LED die elements 382 are produced. During this step, the epi-wafer 380 is diced to produce an array of individual LED die elements 382. The LED die containing epi-wafer 380 can be singulated into individual LED die elements 382 using methods known in the art, including without limitation, abrasive sawing using resin or metal bonded diamond saws, dry laser scribing, water jet guided laser dicing, and wet or dry etching. The resulting array of LED die element-optical element pairs remain bonded to the wafer carrier 370 after this step.

Steps 270 through 290 are not required if the optical element is going to be used in a non-bonded configuration with the LED die. Referring to FIG. 1, an optical element can be optically coupled to the LED die without bonding. In a non-bonded configuration, the optical element 20 can be held in place over the LED die 10 using a clamp while optical contact is achieved via an air gap 150 or a thin optically conducting layer such as an index matching fluid or gel, as described in U.S. Patent Publication No. 2006/0091784 (Connor et al.), entitled LED PACKAGE WITH NON-BONDED OPTICAL ELEMENT.

Each optical element—LED die pair forms a light emitting article in the array. After dicing, the light emitting articles can be removed from the wafer carrier. As mentioned herein, for some applications, the size of the LED die and the size of the output aperture of the optical element can be designed to match. The methods disclosed herein are particularly suited for high volume production of such light emitting articles.

Figure 10:
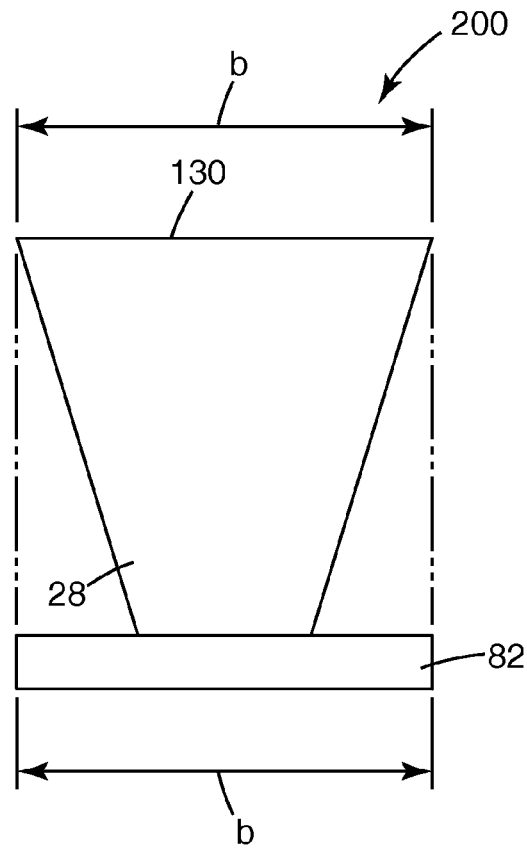
FIG. 10 is a schematic side view of a light emitting article produced by the disclosed embodiments.

FIG. 10 shows a single light emitting article 200 produced by the presently disclosed methods. The optical element 28 has an output aperture 130 characterized by an output aperture size b. Similarly, the LED die element 82 is characterized by an LED die size b. The size can be a one-dimensional measurement, e.g., length, width, or diameter. Alternatively, size can refer to a surface area. The presently disclosed methods produce light emitting articles in which the LED die size is substantially equal in size to the output aperture size. For example, if an optical element has an output aperture that is square, but the LED die is rectangular, the dicing step can be adapted so that only one (e.g., the x-direction) of the two planar (x-y) dimensions substantially match. Alternatively, the dicing step can also be adapted to provide an LED die surface area size matched to the surface area of the output aperture of the optical element.

Figure 11A:
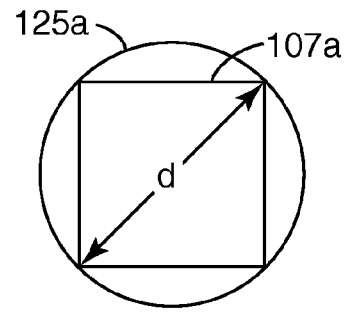
FIGS. 11a-d are bottom views of optical elements and LED dies according to several embodiments.
Figure 11B:
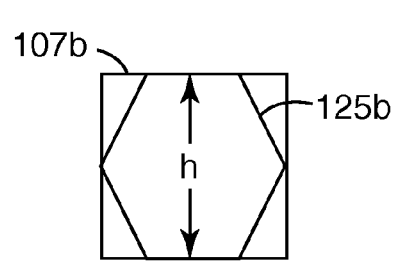
Figure 11C:
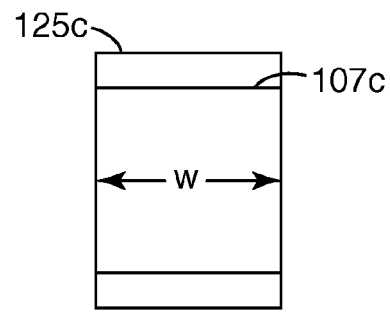
Figure 11D:
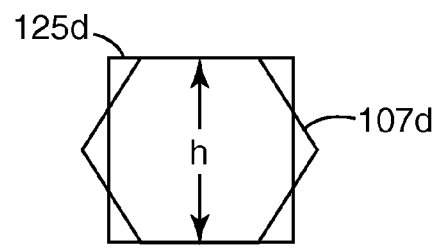

Preferably, the size of the input aperture is matched to the size of the LED die at the emitting surface. FIGS. 11a-11d show exemplary embodiments of such arrangements. In FIG. 11a an optical element having a circular input aperture 125a is optically coupled to an LED die having a square emitting surface 107a. Here, the input aperture and emitting surface are matched by having the diameter "d" of the circular input aperture 125a equal to the diagonal dimension (also "d") of the square emitting surface 107a. In FIG. 11b, an optical element having a hexagonal input aperture 125b is optically coupled to an LED die having a square emitting surface 107b. Here, the height "h" of the hexagonal input aperture 125b matches the height "h" of the square emitting surface 107b. In FIG. 11c, an optical element having a rectangular input aperture 125c is optically coupled to an LED die having a square emitting surface 107c. Here, the width "w" of both the input aperture and the emitting surface are matched. In FIG. 11d, an optical element having a square input aperture 125d is optically coupled to an LED die having a hexagonal emitting surface 107d. Here, the height "h" of both the input aperture and the emitting surface are matched. Of course, a simple arrangement, in which both the input aperture and emitting surface are identically shaped and have the same surface area, also meets this criteria. Here, the surface area of the input aperture is matched to the surface area of the emitting surface of the LED die.

For example, if the LED die emitting surface is a square having sides of 1 mm, the optical element input aperture can be made having a matching square having a 1 mm side. Alternatively, a square emitting surface could be optically coupled to a rectangular input aperture, the rectangle having one of its sides matched in size to the size of the emitting surface side. The non-matched side of the rectangle can be larger or smaller than the side of the square. Optionally, an optical element can be made having a circular input aperture having a diameter equal to the diagonal dimension of the emitting surface. For example, for a 1 mm by 1 mm square emitting surface a circular input aperture having a diameter of 1.41 mm would be considered matched in size for the purpose of this application. The size of the input aperture can also be made slightly smaller than the size of the emitting surface.

This can have advantages if one of the goals is to minimize the apparent size of the light source, as described in commonly owned U.S. Patent Publication No. 2006/0091411, entitled HIGH BRIGHTNESS LED PACKAGE.

FIG. 5c shows an array of optical elements 36 having a lapped input aperture surface 27. In some applications, it may be desirable to provide an array of optical elements wherein the array has a total thickness variation (TTV) of less than 100 ppm expressed as a percentage of a characteristic lateral dimension of the array (e.g., diameter). For example, a thickness variation of 5 µm measured for an array having a characteristic lateral dimension of 50 mm, would be expressed as a TTV of 100 ppm. In other applications, it may be desirable to provide an optical element with a finished input aperture that has a surface roughness of less than a desired tolerance, e.g., peak to valley surface roughness of less than 50 nm. Alternatively, it may be desirable to provide an array of optical elements wherein the input apertures and output apertures are parallel to each other within a certain tolerance, e.g., parallel to within 1°.

Although the presently disclosed methods have been described in detail in context of an optical element composed of a single material, these methods are also applicable to optical elements comprising two or more materials. For example, the methods can be used to manufacture compound optical elements as disclosed in U.S. Patent Publication No. 2006/0091798 (Ouderkirk et al.), entitled HIGH BRIGHTNESS LED PACKAGE WITH COMPOUND OPTICAL ELEMENT(S). Similarly, the presently disclosed methods can be used to provide a plurality of optical elements to be combined with a single LED die, as described in U.S. Patent Publication No. 2006/0092532 (Ouderkirk et al.), entitled HIGH BRIGHTNESS LED PACKAGE WITH MULTIPLE OPTICAL ELEMENTS.

The presently disclosed methods can similarly be used to provide an array of optical elements having one or more converging sides as disclosed in U.S. patent application Ser. No. 11/381,324 (Leatherdale et al.), entitled LED PACKAGE WITH CONVERGING OPTICAL ELEMENT.

The presently disclosed methods can also be used to provide an array of optical elements which is then combined with other elements prior to combining with LED dies. For example, an array of optical elements can be placed in optical contact with a patterned low refractive index layer as described in U.S. Patent Publication No. 2006/0091411 (Ouderkirk et al.), entitled HIGH BRIGHTNESS LED PACKAGE. Similarly, the array of optical elements can be placed in optical contact with a birefringent material or a reflective polarizer as described in U.S. Patent Publication No. 2006/0091412 (Wheatley et al.), entitled POLARIZED LED. The array of optical elements can similarly be combined with a layer of phosphor material. For example, a phosphor coating can be added to the optical element array, or a phosphor coated multilayer optical film can be placed in optical contact with the array of optical elements, as described in U.S. Patent Application Publication No. 2004/0116033 (Ouderkirk et al.), entitled METHODS OF MAKING PHOSPHOR BASED LIGHT SOURCES HAVING AN INTERFERENCE REFLECTOR.

All references and publications cited herein are expressly incorporated herein by reference in their entirety into this disclosure. Illustrative embodiments of this disclosure are discussed and reference has been made to possible variations within the scope of this disclosure. These and other variations and modifications in the disclosure will be apparent to those skilled in the art without departing from the scope of the disclosure, and it should be understood that this disclosure is not limited to the illustrative embodiments set forth herein. Accordingly, the disclosure is to be limited only by the claims provided below.

What is claimed is:

1. An array of light emitting articles, comprising:
an array of optical elements, each optical element having an input aperture, wherein the array of optical elements has a lapped input aperture surface; and
an array of LED dies, wherein each LED die is optically coupled to one or more optical elements at the input aperture,
wherein each optical element has an output aperture and wherein the output aperture is matched in size to the LED die.

2. The array of claim 1, wherein the size of the LED die and the size of the output aperture are matched in one-dimension.

3. The array of claim 1, wherein each optical element is shaped as a taper.

4. The array of claim 1, wherein the array of optical elements is bonded to the array of LED dies.

5. The array of claim 1, further comprising a reflective polarizer in optical contact with the array of optical elements.

6. The array of claim 1, wherein the LED dies are rectangular in cross section.

7. An array of light emitting articles, comprising:
an array of optical elements, each optical element having an input aperture and an output aperture, each aperture having a size; and
an array of LED dies, each LED die having a size, wherein each LED die is optically coupled to one optical element at the input aperture and wherein the output aperture size of the optical element is matched to the LED die size.

8. The array of claim 7, wherein the LED die size and the output aperture size are matched in one-dimension.

9. The array of claim 7, wherein each optical element is shaped as a taper.

10. The array of claim 7, wherein the array of optical elements has a lapped input aperture surface.

11. The array of claim 7, wherein the array of optical elements is bonded to the array of LED dies.

12. The array of claim 7, further comprising a reflective polarizer in optical contact with the array of optical elements.

13. The array of claim 7, wherein the LED dies have a rectangular cross section.

14. A light emitting article, comprising:
an optical element having an input aperture and an output aperture, each aperture having a size; and
an LED die optically coupled to the optical element, the LED die having an LED die size, and wherein the output aperture size of the optical element is matched to the LED die size.

15. The article of claim 14, wherein the LED die size and the output aperture size are matched in one-dimension.

16. The article of claim 14, wherein the optical element is shaped as a taper.

17. The array of claim 14, wherein the array of optical elements is bonded to the array of LED dies.

18. The array of claim 14, further comprising a reflective polarizer in optical contact with the array of optical elements.

19. The array of claim 14, wherein the LED dies have a rectangular cross section.

* * * * *